(12) United States Patent
Su et al.

(10) Patent No.: US 9,427,893 B2
(45) Date of Patent: Aug. 30, 2016

(54) MOLDING PRESS AND A PLATEN FOR A MOLDING PRESS

(71) Applicants: Jian Xiong Su, Singapore (SG); Teng Hock Kuah, Singapore (SG); Shu Chuen Ho, Singapore (SG); Jiapei Ding, Singapore (SG); Ravindra Raghavendra, Singapore (SG)

(72) Inventors: Jian Xiong Su, Singapore (SG); Teng Hock Kuah, Singapore (SG); Shu Chuen Ho, Singapore (SG); Jiapei Ding, Singapore (SG); Ravindra Raghavendra, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 14/489,640

(22) Filed: Sep. 18, 2014

(65) Prior Publication Data
US 2016/0082624 A1    Mar. 24, 2016

(51) Int. Cl.
*B29C 33/30* (2006.01)
*B29C 43/36* (2006.01)
*H01L 21/56* (2006.01)
*B29C 43/32* (2006.01)

(52) U.S. Cl.
CPC .......... *B29C 33/308* (2013.01); *B29C 33/307* (2013.01); *B29C 43/32* (2013.01); *H01L 21/56* (2013.01)

(58) Field of Classification Search
CPC . H01L 21/565; B29C 33/308; B29C 33/307; B29C 43/361; B29C 43/32; B29C 45/376; B29C 70/78
USPC ........................................................ 425/127
See application file for complete search history.

(56) References Cited

U.S. PATENT DOCUMENTS

| 5,989,471 | A  | * | 11/1999 | Lian ................. | H01L 21/67126 100/258 R |
|---|---|---|---|---|---|
| 6,030,569 | A  | * | 2/2000 | Yu ........................ | B29C 45/661 264/272.17 |
| 6,471,501 | B1 | * | 10/2002 | Shinma .................. | B29C 43/36 257/E21.504 |
| 6,627,137 | B2 | * | 9/2003 | Saito ................. | B29C 45/14065 264/272.15 |
| 6,712,594 | B2 | * | 3/2004 | Saito ....................... | B29C 45/14 249/158 |
| 7,901,196 | B2 | * | 3/2011 | Narasimalu ............. | B29C 43/36 425/116 |
| 2005/0271767 | A1 | * | 12/2005 | Kruidering ........... | B29C 33/303 425/589 |
| 2011/0193261 | A1 | * | 8/2011 | Uragami ................. | B29C 43/18 264/279 |

* cited by examiner

*Primary Examiner* — Robert B Davis
(74) *Attorney, Agent, or Firm* — Ostrolenk Faber LLP

(57) ABSTRACT

Disclosed is a platen for a molding press for encapsulating semiconductor dies on a substrate, the platen comprising: a first mold chase having a first mold chase surface; the platen being operable to cooperate with a further platen having a second mold chase with a second mold chase surface to clamp a substrate, which is held against a substrate-facing surface relating to either the first or second mold chase surface, between the first and second mold chase surfaces to define at least one mold cavity with respect to the substrate; wherein the platen further comprises a rotational mounting device on which either the first or second mold chase is rotatable about at least one axis passing through the center of the substrate-facing surface to adjust the relative arrangement of the first and second mold chase surfaces. Also disclosed is a molding press comprising the platen, and the further platen cooperating with the platen.

24 Claims, 12 Drawing Sheets

MOLDING PRESS AND A PLATEN FOR A MOLDING PRESS

BACKGROUND

The present invention relates to the field of semiconductor assembly and packaging, and more particularly, to a molding press (and a platen thereof) for applying an encapsulant to semiconductor dies on a substrate.

Packaging, also known as encapsulation, is an important part of the semiconductor assembly process. Typically, encapsulation is performed by either transfer molding or compression molding.

In transfer molding, the molding system includes a first platen having a supply pot which receives a molding compound, for example in the form of a solid pellet. The first platen also has a plurality of cavities. The first platen is pressed against a second platen on which a substrate carrying a plurality of semiconductor dies is held, such that the cavities of the first platen overlie the semiconductor dies. The molding compound is melted, with the application of heat and pressure, to a liquid state, and the liquefied molding compound is then forced by a plunger into runners connected between the plunger and the molding cavities to enter into the molding cavities via narrow gates. The molding compound is then cured and the encapsulated substrate then removed from the mold.

In compression molding, a molding compound in the form of powder or liquid or paste resin is loaded into one or more mold cavities of a bottom platen (in the case of die-down molding) or directly onto a substrate which is held on the bottom platen (in the case of die-up molding). A heater plate in the bottom platen is then used to melt the molding compound. Next, a mold chase of a top platen is clamped against a mold chase of the bottom platen to form a mold cavity between the top and bottom platens, with the molten molding compound then being cured to form a mold cap which encapsulates the dies.

In either a transfer molding or a compression molding encapsulation process, it is critical to maintain substantial parallelism between the substrate and the opposed surface of the mold cavity. Otherwise, there may be defects in the mold cap caused by incomplete filling of the mold cavity.

There remains a need for a molding press which overcomes or alleviates at least one of the foregoing difficulties, or which at least provides a useful alternative.

SUMMARY

Certain embodiments of the invention relate to a molding press for encapsulating a substrate, the molding press comprising:
a first mold chase with a first mold chase surface; and
a second mold chase with a second mold chase surface;
the first and second mold chases being operable to clamp a substrate, which is held against a substrate-facing surface relating to either the first or second mold chase surface, between the first and second mold chase surfaces to define at least one mold cavity with respect to the substrate;
wherein the molding press further comprises a rotational mounting device on which either the first or second mold chase is rotatable about at least one axis passing through the centre of the substrate-facing surface to adjust the relative arrangement of the first and second mold chase surfaces.

Other embodiments of the invention relate to a platen for a molding press for encapsulating a substrate, the platen comprising:
a first mold chase having a first mold chase surface;
the platen being operable to cooperate with a further platen having a second mold chase with a second mold chase surface to clamp a substrate, which is held against a substrate-facing surface relating to either the first or second mold chase surface, between the first and second mold chase surfaces to define at least one mold cavity with respect to the substrate;
wherein the platen further comprises a rotational mounting device on which either the first or second mold chase is rotatable about at least one axis passing through the centre of the substrate-facing surface to adjust the relative arrangement of the first and second mold chase surfaces.

By ensuring that the at least one axis of rotation passes through the centre of the substrate-facing surface, it is possible to allow the relative orientation of the first and second mold chase surfaces to be adjusted as the first and second mold chases are being clamped together, to enhance the co-planarity between the substrate and the opposed surface of the at least one mold cavity. This allows creation of a molding cavity of substantially uniform depth, and makes it possible to substantially avoid molding defects caused by incomplete filling of the mold cavity, for example. Additionally, by centering the rotation axis or axes on the substrate it is possible to avoid introducing an offset between the substrate centre and the opposed mold surface.

In certain embodiments, the platen comprises a drive mechanism configured to rotate the first mold chase.

In certain embodiments, the rotational mounting device may be configured to allow rotation of either the first or second mold chase about two orthogonal axes passing through the centre of the substrate-facing surface to adjust the relative arrangement of the first and second mold chase surfaces. The rotational mounting device may comprise roller bearings. The platen may comprise a middle portion to which the top portion is mounted by a first rotational mounting, and a base portion to which the middle portion is mounted by a second rotational mounting. The drive mechanism may be configured to rotate the top portion relative to the middle portion about the first rotational mounting, and the middle portion relative to the base portion about the second rotational mounting.

The platen may comprise a plurality of load cells positioned to measure clamping forces applied during clamping of a substrate. The drive mechanism may be configured to rotate the top portion and/or the middle portion to balance said clamping forces. The load cells may be positioned between first and second parts of the top portion of the platen, or may be positioned beneath the base portion. In either case, the load cells may be aligned with the two orthogonal axes.

In certain embodiments, the first mold chase may comprise a clamping plate coupled to the top portion by a plurality of springs, the clamping plate comprising a plurality of gauging sensors positioned to measure spring compression at different locations on the clamping plate. The drive mechanism may be configured to rotate the top portion and/or the middle portion to minimize any differences in the measured spring compression at the different locations. The gauging sensors may be positioned in alignment with the two orthogonal axes.

BRIEF DESCRIPTION OF THE DRAWINGS

Embodiments of the invention will now be described, by way of non-limiting example only, with reference to the accompanying drawings in which.

DETAILED DESCRIPTION

Figure 1:
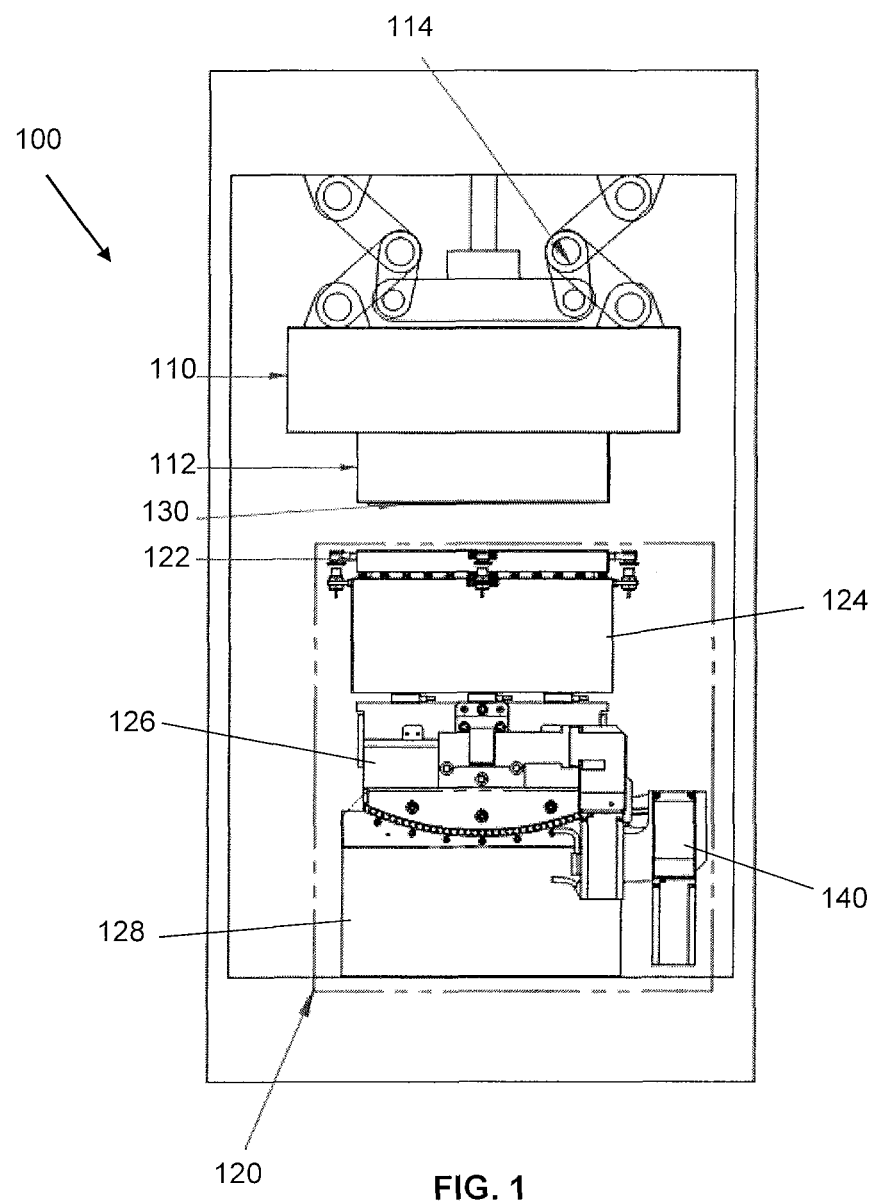
FIG. 1 is a side elevation view of a molding press, in an unclamped configuration, according to embodiments of the invention.
Figure 2:
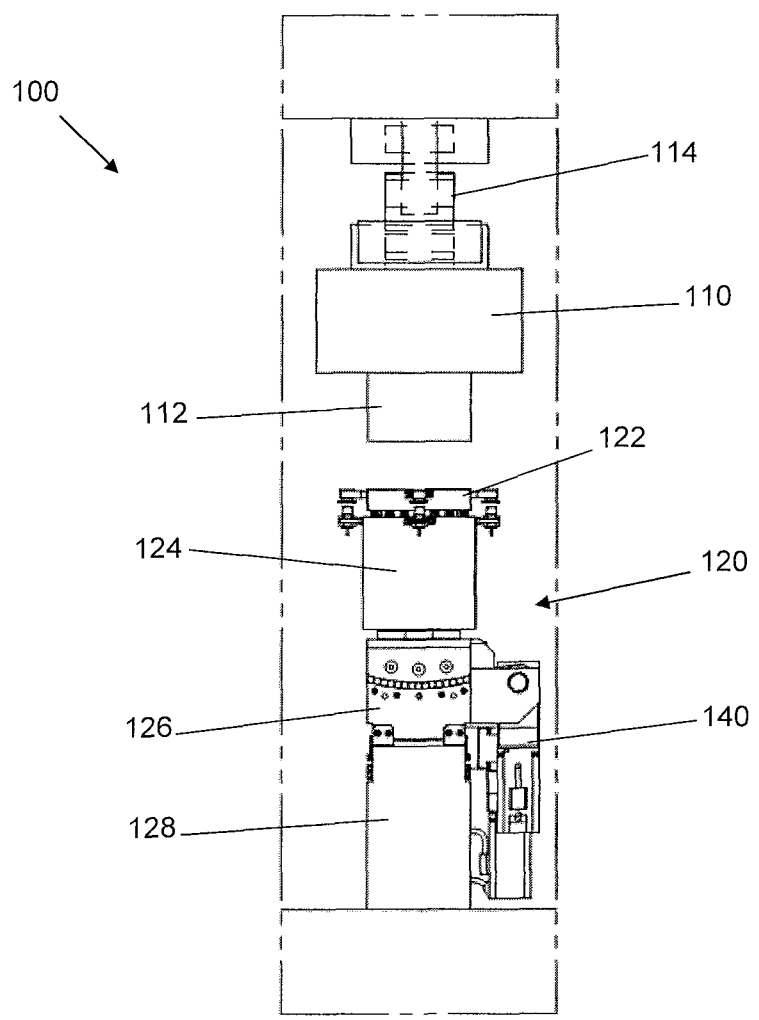
FIG. 2 is an alternative side elevation view of the molding press of FIG. 1.
Figure 3:
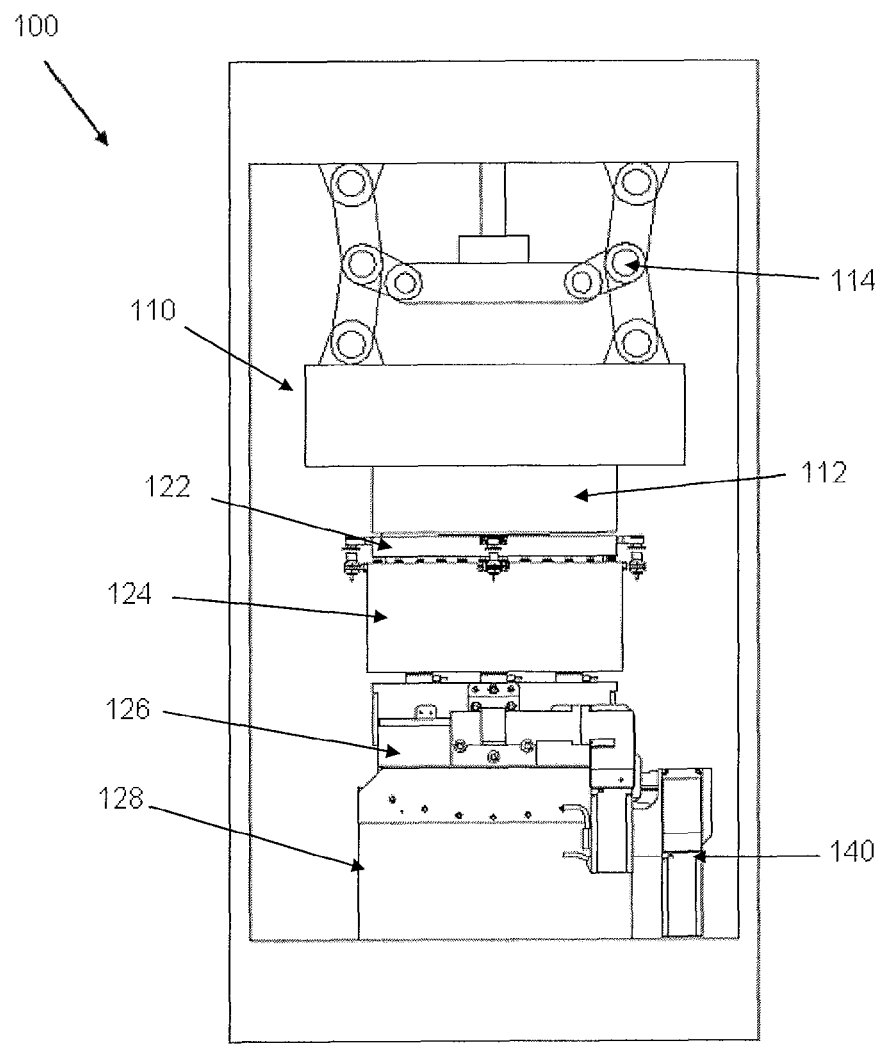
FIG. 3 is a side elevation view of the molding press of FIG. 1 in a clamped configuration.

Referring initially to FIG. 1 and FIG. 2, there is shown a molding press 100 having an upper (first) platen 110 and a lower (second) platen 120. The molding press is in an open or unclamped configuration. In operation, the upper platen 110 is urged towards the lower platen using a toggle mechanism 114 of known construction, in order to clamp a substrate 130 between the upper platen 110 and lower platen 120 as shown in FIG. 3, prior to executing a molding procedure. The lower platen 120 has an angular adjustment mechanism which can be used to adjust the relative orientation of planar surfaces of the mold chases of the upper and lower platens to account for substrate unevenness, in a manner which will be described in detail below. The molding press 100 shown in FIG. 1-3 is particularly suitable for compression molding, but the angular adjustment mechanism described below in relation to lower platen 120 is equally applicable to the upper platen 110 and also to transfer molding processes as will become apparent.

The upper platen 110 carries an upper (first) mold chase 112 to which a substrate 130 can be secured by a vacuum. The lower platen 120 carries a lower (second) mold chase 122 against which the upper mold chase 112 is clamped when the toggle mechanism 114 is actuated, as shown in FIG. 3.

The lower platen 120 comprises a top portion 124 rotatably mounted to a middle portion 126 which is in turn rotatably mounted to a base portion 128. The lower platen 120 also comprises a drive mechanism 140 for controlling the relative movements of the top, middle and base portions, using a microcontroller of known type coupled to a general purpose computer system (not shown), for example.

Figure 4:
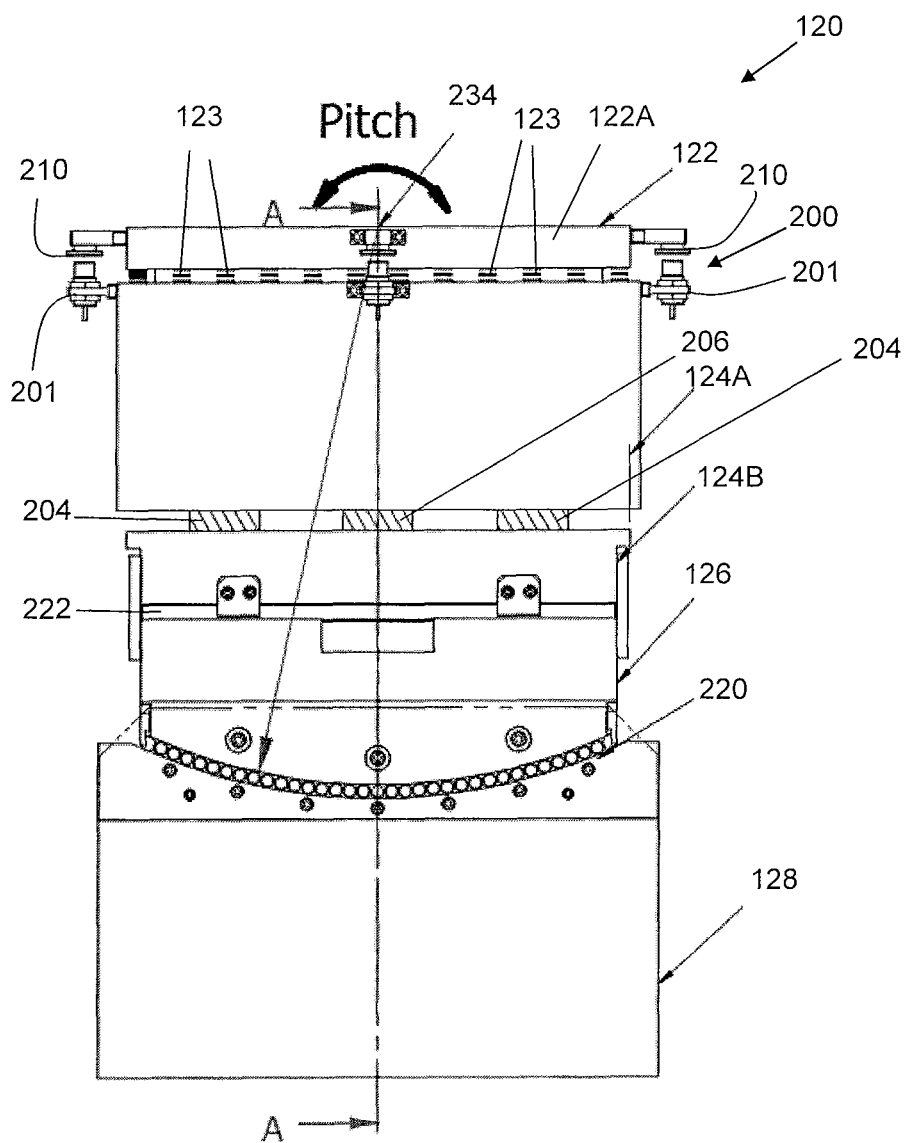
FIG. 4 is a side elevation view of a lower platen of the molding press of FIG. 1.
Figure 5:
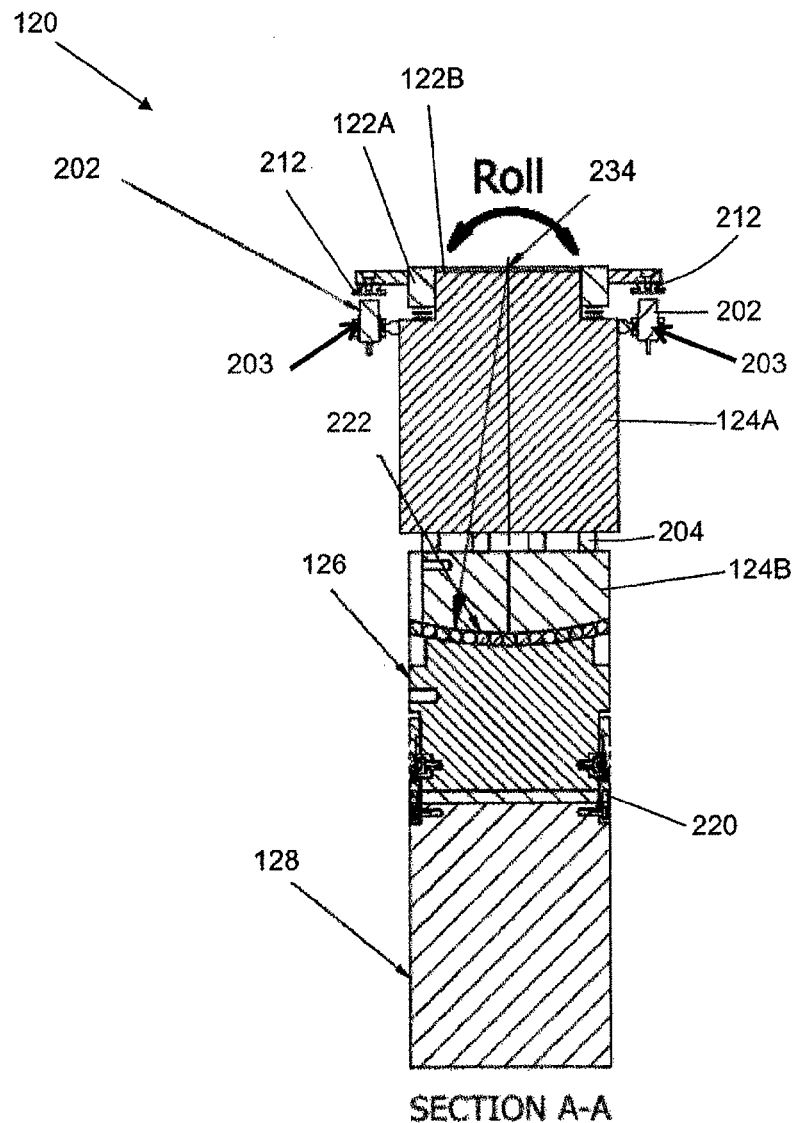
FIG. 5 is a cross-sectional view through the line A-A of FIG. 4.

As shown in FIG. 4 and FIG. 5, in which the drive mechanism 140 is omitted for clarity, lower platen 120 comprises a rotational mounting device (shown as a pair of rotational mountings 220 and 222). Each rotational mounting 220, 222 comprises a roller bearing mechanism, comprising a series of cylindrical rollers in a part-circular raceway. Advantageously, the use of rotational mountings 220, 222 allows pivoting movement of the lower mold chase 122 without the use of bushing or guiding mechanisms or the like, which would lead to a structurally overconstrained system.

Figure 6:
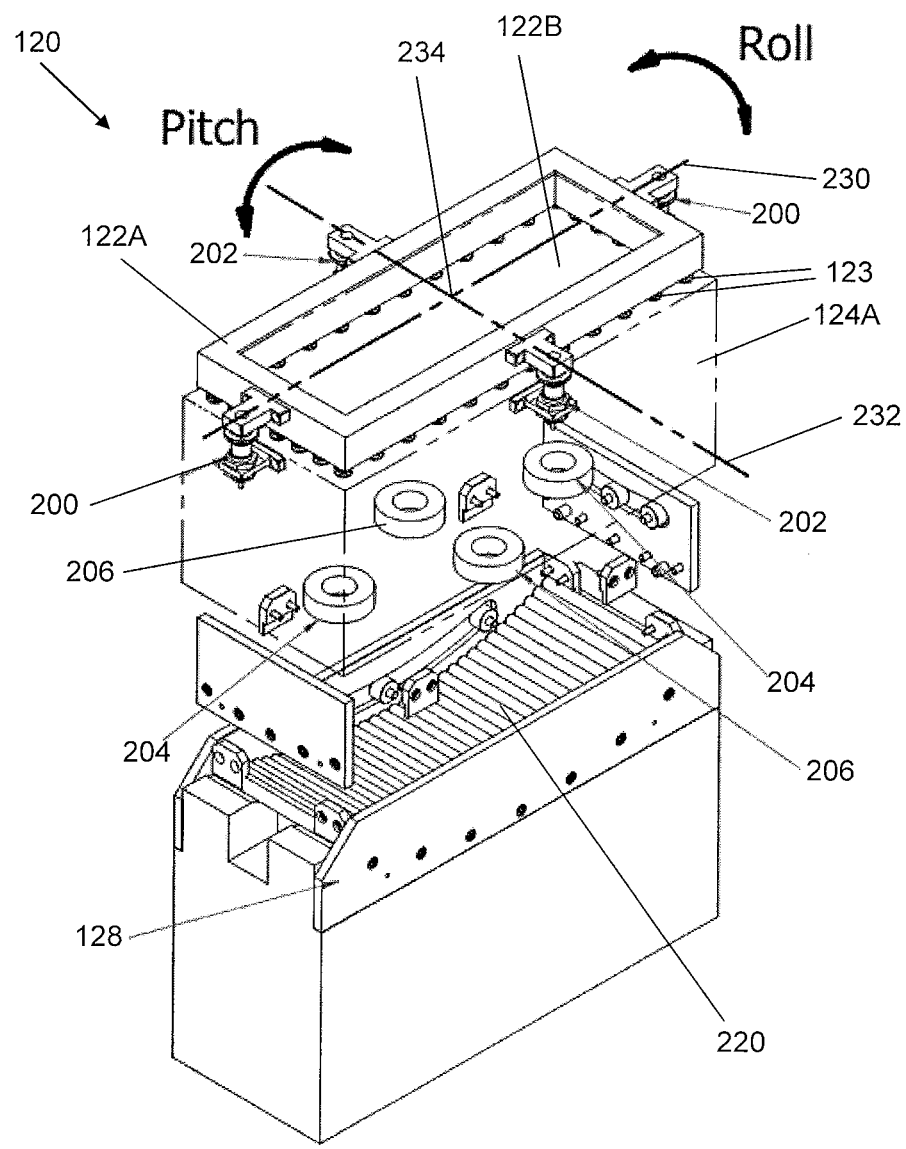
FIG. 6 is a partial exploded perspective view of the platen of FIG. 4.

The top portion 124 of the platen 120 comprises upper 124A and lower 124B parts, and is mounted to the middle portion 126 by the first rotational mounting 222, the middle portion 126 in turn being mounted to the base portion 128 by the second rotational mounting 220. The rotational mountings 220, 222 provide two degrees of rotational freedom for the lower platen 120 with the top, middle and base portions 124, 126, 128 being able to rotate relative to each other about two orthogonal axes 230 and 232 which meet at the centre 234 of a plane passing through the upper surface of the lower mold chase 122 (FIG. 6). In cross-section, each raceway forms part of a circle with its centre at the intersection 234 of the two orthogonal axes 230, 232.

Figure 7:
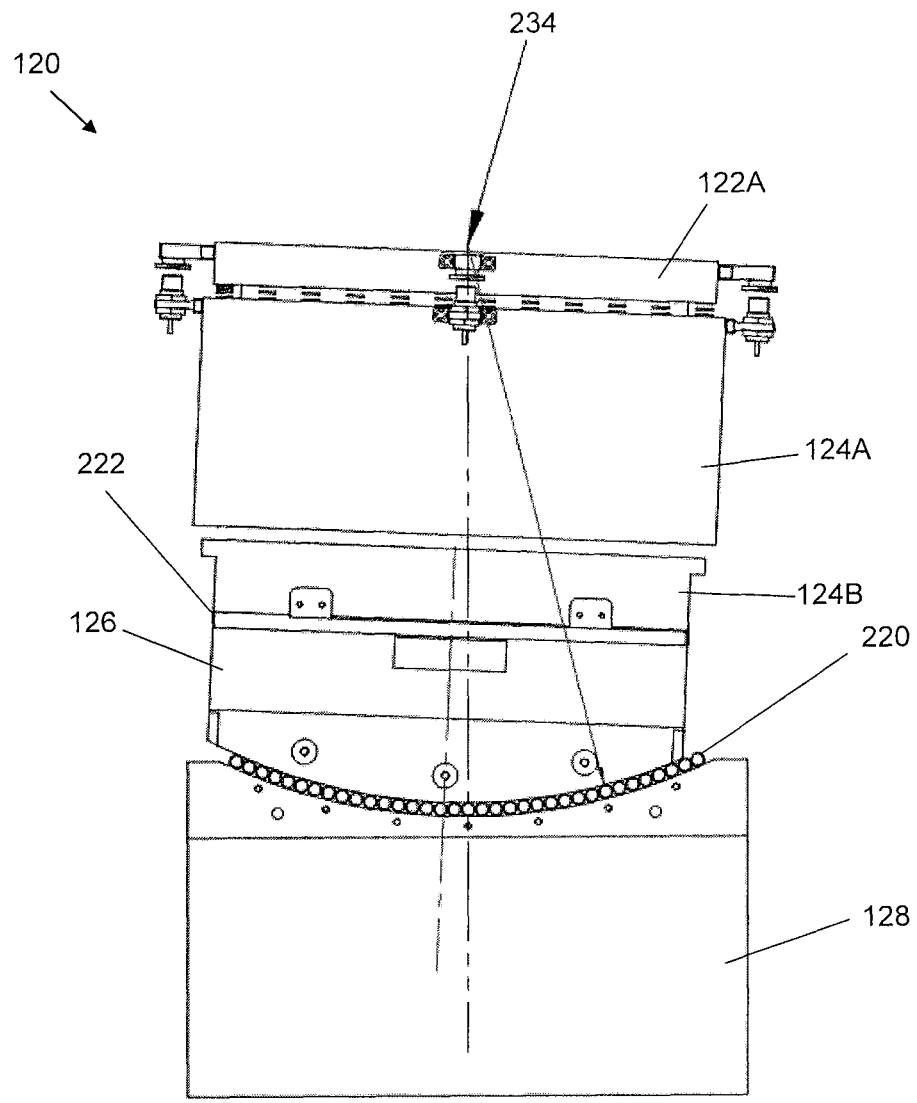
FIG. 7 and FIG. 8 are side elevation views of the platen showing a pitch-and-roll orientation adjustment mechanism.
Figure 8:
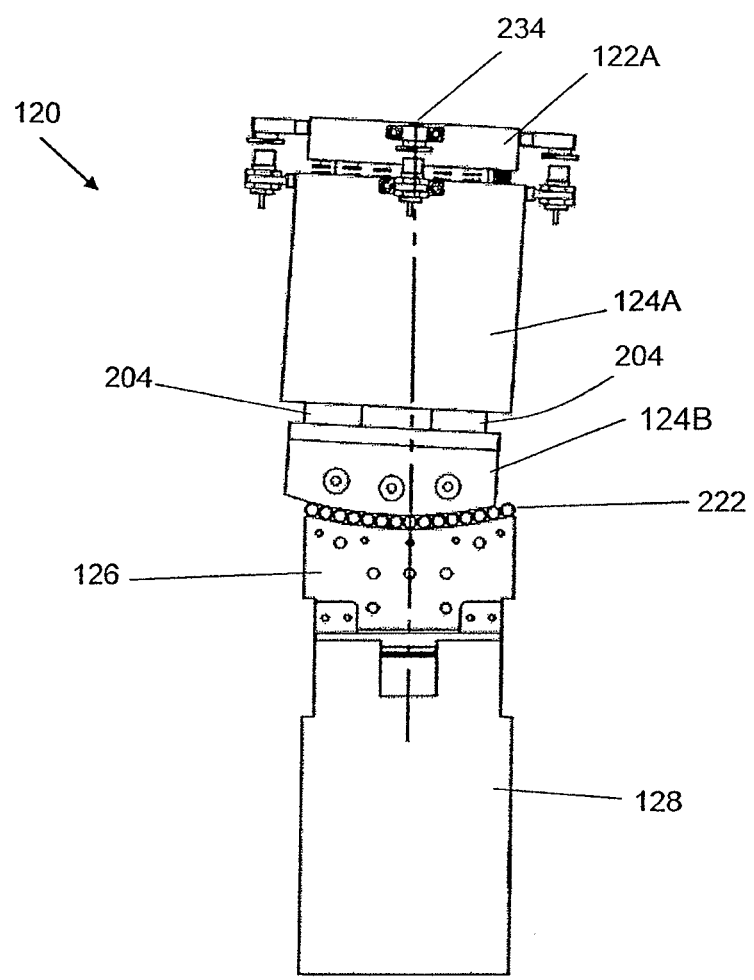

Accordingly, the top, middle and base units 124, 126 and 128 together with the mountings 220, 222 provide a pitch-and-roll mechanism to allow angular alignment of a substrate at the upper surface of lower mold chase 122, via pivoting movement of the upper surface about the centre 234 as depicted in FIG. 7 and FIG. 8. The pitch-and-roll mechanism may be passive, such that the top 124 and middle 126 portions naturally roll on the roller bearings in response to differences in contact forces at respective edges or corners of the clamping plate 122. However, it is particularly advantageous to make use of an active drive mechanism 140 which drives the top 124 and middle 126 portions responsive to measured differences in the contact forces, the measured differences being obtainable using gauging sensors and/or load cells as will be described below.

The lower mold chase 122 comprises a clamping plate 122A resiliently coupled to the top portion 124 by a plurality of springs 123 extending around a periphery of the lower surface of the clamping plate 122A. Clamping plate 122A has an exposed interior region having a surface 122B which faces towards substrate 130 when the substrate is clamped between the upper mold chase 112 and lower mold chase 122. The surface of the upper mold chase 112 to which the substrate is retained thus defines a first plane while the substrate-facing surface 122B of the lower mold chase 122 defines a second plane. When the substrate 130 is clamped, a mold cavity is defined between the substrate and the substrate-facing surface 122B, which may be an upper surface or partial upper surface of the top portion 124 of the lower platen 120 (as shown in FIG. 5), or alternatively may be an upper surface of a plunger which is mounted within the top portion 124 for reciprocating movement along an axis towards the upper mold chase 112 to compress a molding resin within the mold cavity.

The lower platen 120 further comprises a plurality of load cells 204, 206, and a plurality of gauging sensors 200, 202, which may be inductive sensors, for example.

As shown in FIG. 4, first gauging sensors 200 each comprise an optical beam component 201 configured to transmit an optical beam towards a target 210 and to measure the distance between the beam 201 and target 210 according to a measured reflected beam. The targets 210 extend from a first opposed pair of edges of the clamping plate 122A and are aligned with the "roll" axis 230. The beam components 201 extend from a first opposed pair of edges of the top portion 124 of the lower platen 120, and are likewise aligned with axis 230 and also with respective targets 210. Accordingly the gauging sensors 200 are positioned to detect changes in distance which are due to compression and expansion of springs 123. More particularly, the gauging sensors 200 can detect an imbalance in the contact forces applied at the opposed edges of the clamping plate 122A, due to differential spring compression at the edges and thus a difference in spacings between the respective beam components 201 and targets 210, and the measured difference can then be used to adjust the angular orientation of the top portion 124.

Similarly, as shown in FIG. 5, second gauging sensors 202 each comprise a target 212 extending from one of a pair of opposed edges of the clamping plate 122A and are aligned with the "pitch" axis 232, which is orthogonal to the "roll" axis 230. Second gauging sensors 202 each also comprise a beam component 203 extending from a respective opposed edge of the top portion 124 of the lower platen 120, the beam components 203 being aligned with axis 230 and also with respective targets 212.

The load cells 204, 206 are located within the top portion 124 of the lower platen 120, specifically between an upper part 124A and a lower part 124B, and provide an alternative mechanism for monitoring differences in contact forces applied to the clamping plate 122A. The load cells are configured to measure compressive forces acting on the upper surface of the clamping plate 122A. First load cells 204 are located approximately below first respective opposed edges of the clamping plate 122A and second load cells 206 are located approximately below second respective opposed edges of the clamping plate 122A. The first load cells 204 are in alignment with the "roll" axis 230 and the second load cells 206 are in alignment with the "pitch" axis 232.

If load cells 204, 206 are used for detecting an imbalance in clamping forces and to thereby provide feedback to drive mechanism 140 for angular alignment purposes, for example in a transfer molding process, the resilient coupling of clamping plate 122A to the top portion 124 may be replaced with a rigid connection, and the gauging sensors 200, 202 may be omitted.

Figure 9:
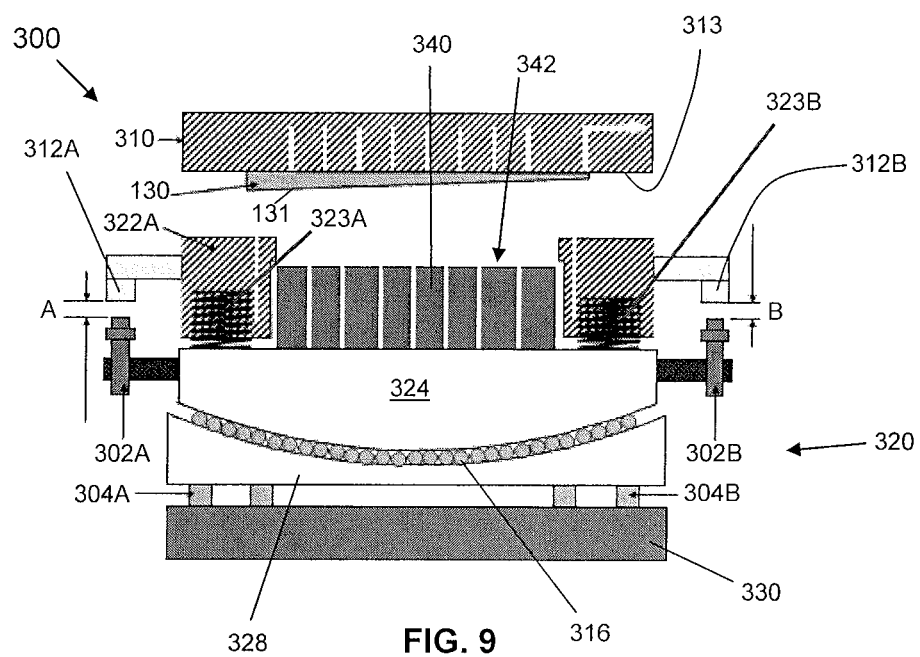
FIGS. 9 to 11 are schematic cross-sectional views of an alternative embodiment of a lower platen showing pitch-and-roll adjustment during a compression molding process.
Figure 10:
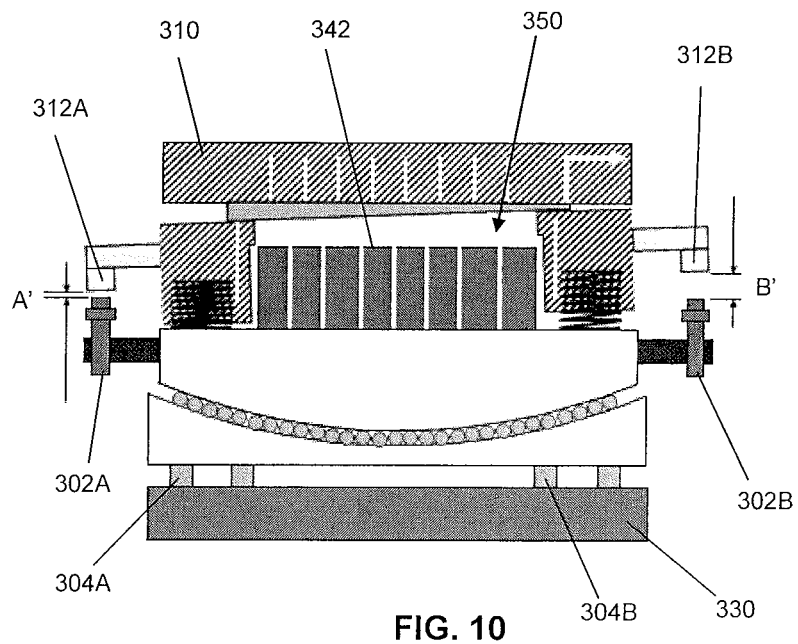
Figure 11:
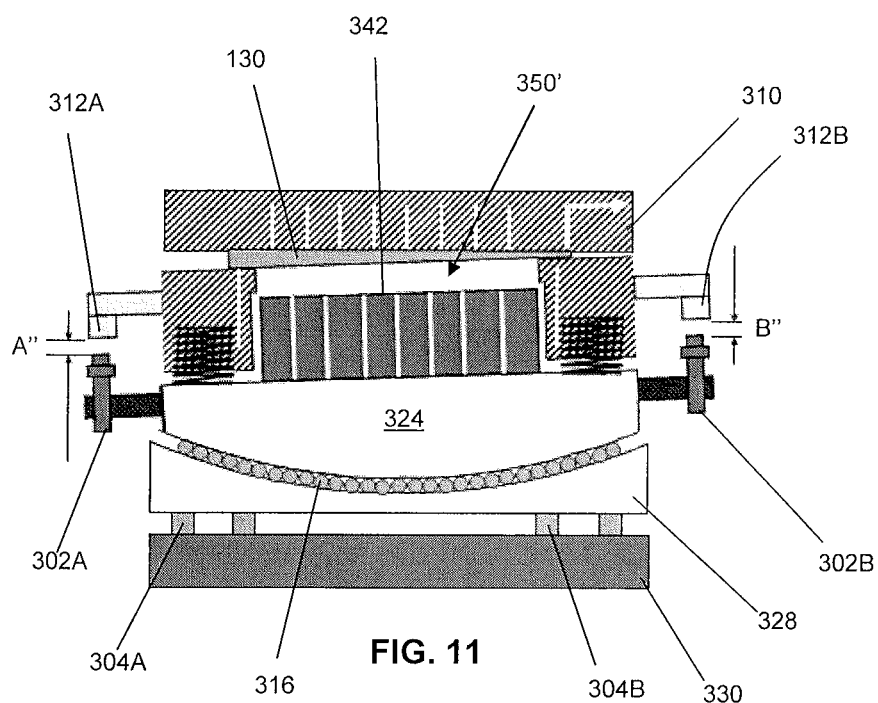

An example of angular alignment of surfaces of the upper and lower mold chases during a compression molding process will now be described with reference to FIG. 9-11. Referring firstly to FIG. 9, a molding press 300 has an upper (first) platen with an upper (first) mold chase 310 to which a substrate 130 is secured by a vacuum at a surface 313. Molding press 300 also has a lower (second) platen 320 with an angular alignment mechanism which operates in similar fashion to that described above in relation to lower platen 120. Lower platen 320 has a rotational mounting device comprising a pair of rotational mountings, as for lower platen 120, although only one rotational mounting 316 (equivalent to rotational mounting 220 of lower platen 120) is shown for illustrative purposes. A top portion 324 of the lower platen 320 is mounted to a middle portion (not shown) which is in turn mounted to a base portion 328 by the rotational mounting 316, such that the top portion 324 and middle portion can rotate relative to the base portion 328 on rotational mounting 316.

Extending from opposed edges of the top portion 324 are beam components 302A and 302B of respective gauging sensors. Corresponding targets 312A and 312B extend from opposed edges of a clamping plate 322 of a lower (second) mold chase of the lower (second) platen 320, the clamping plate 322 being resiliently coupled to the top portion 324 by springs 323A and 323B at its periphery. The beam components 302A and 302B are aligned with their respective targets 312A and 312B and are also aligned with an axis (not shown) passing through the centre of a plane defined by the upper surface of the clamping plate 322, as previously described. The top portion 324 has a packing plunger 340 with an upper surface 342 which faces the substrate 130 when the substrate 130 is clamped between the upper and lower mold chases. The packing plunger 340 may be a stationary component or may be mounted for reciprocating movement within the top portion 324 to compress a molding resin loaded in a mold cavity 350 defined between the plunger upper surface 342 and the substrate 130 (FIG. 10).

In FIG. 9, the molding press 300 is in an unclamped configuration and the springs 323A and 323B are compressed only by the weight of the clamping plate 322. The distance between beam component 302A and target 312A is A, and between beam component 302B and target 312B is B. Prior to clamping, A will differ from B by an amount $a = |A-B|$.

The substrate 130 retained at surface 313 of upper mold chase 310 has a surface 131 facing the lower mold chase which is not parallel to surface 313 or to upper surface 342 of the packing plunger 340. Accordingly, even though a first plane defined by the surface 313 of upper mold chase is parallel to a second plane defined by the upper surface 342, when the molding press is placed in a clamped configuration with substrate 130 pressed against clamping plate 322, the mold cavity 350 formed between the surface 131 and the upper (substrate-facing) surface 342 of the plunger will be uneven (FIG. 10).

To address the unevenness of the mold cavity 350, a microprocessor coupled to a drive mechanism (similar to drive mechanism 140, for example) receives feedback from the gauging sensors (302A, 312A) and (302B, 312B) as the substrate 130 is clamped against the clamping plate 322. The substrate 130 is slightly thicker at edge "A" of the clamping plate 322, so that edge of the substrate will contact the clamping plate 322 first. As it does so, it begins to compress spring 323A such that distance A begins to decrease. The upper mold chase 310 continues to press down on clamping plate 322 until the opposite edge of the substrate contacts edge "B" of the clamping plate 322. At this point, the gauging sensors measure distances A', which is less than A, and B', which may be larger than B due to the movement of the clamping plate 322. Since the microprocessor now sees a difference $|A'-B'|$ which is no longer equal to a, it will be apparent that there is unevenness in the substrate surface 131 and that correction is required to ensure parallelism between the substrate surface 131 and the packing plunger surface 342 during encapsulation. In this case, the microprocessor detects that there is greater compression at edge "A", so that the drive mechanism 140 should be actuated to rotate top portion 324 on rotational mounting 316 towards edge "A", until the difference between distances A" and B" is close to the originally measured difference a (FIG. 11). This causes the orientation of the plane defined by the plunger upper surface to change such that the plunger upper surface 342 is parallel to substrate surface 131 as shown in the mold cavity 350' of FIG. 11. At this point, resin in the mold cavity 350' can be heated, the packing plunger 342 urged towards the substrate surface 131, and the resin then cured to encapsulate dies on the substrate surface 131 with a substantially even molding cap thereby being formed on the dies.

Figure 12:
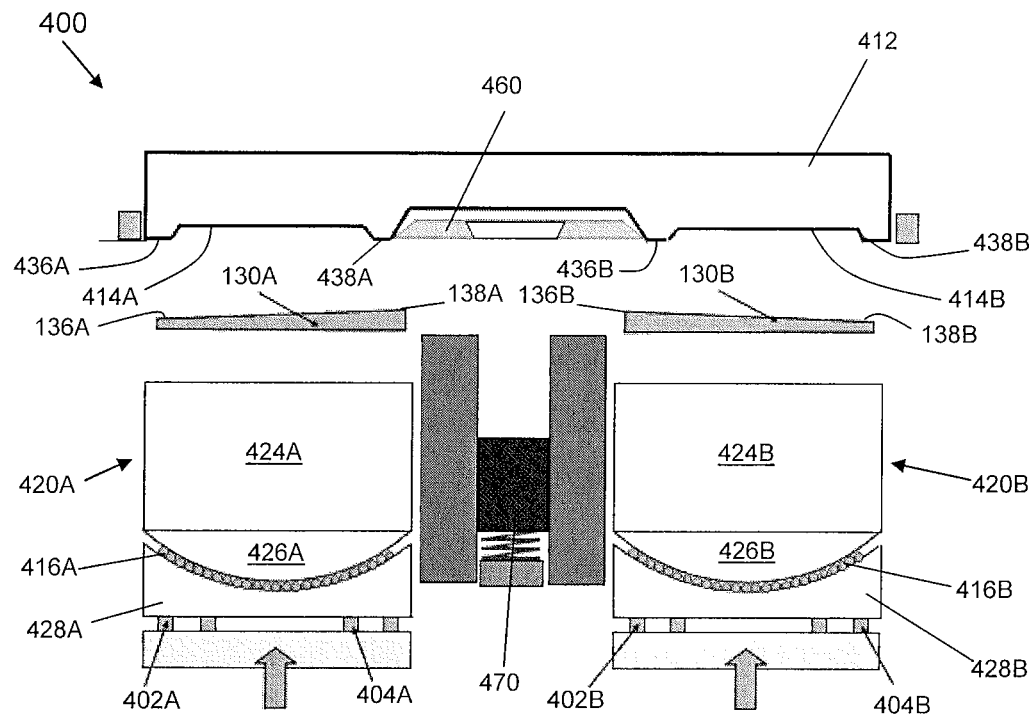
FIGS. 12 to 14 are schematic cross-sectional views of an alternative embodiment of a lower platen showing pitch-and-roll adjustment during a transfer molding process.

An example of angular alignment of surfaces of the upper and lower mold chases during a transfer molding process will now be described with reference to FIG. 12-14. In FIG. 12, a transfer molding press comprises an upper (first) platen having an upper (first) mold chase 412, and a pair of lower (second) platens 420A and 420B, each having a lower (second) mold chase comprising a substrate-facing surface 422A and 422B respectively. Respective substrates 130A and 130B can be retained against respective substrate-facing surfaces 422A and 422B by vacuum.

Upper mold chase 412 comprises a plunger pot and runner system 460 having channels through which molten resin can be injected, by plunger 470, into mold cavities formed between surface 414A and substrate 130A, and between surface 414B and substrate 130B, during a transfer molding process when the substrates 130A and 130B are clamped. It will be appreciated that any number of recesses can be formed in the upper mold chase 412 to cooperate with corresponding lower mold chases of respective lower platens 420A, 420B, etc. In some embodiments only a single lower platen, cooperating with a single recess of the upper mold chase 412, may be employed, although it is operationally more efficient to provide multiple lower platens per upper platen.

Figure 13:
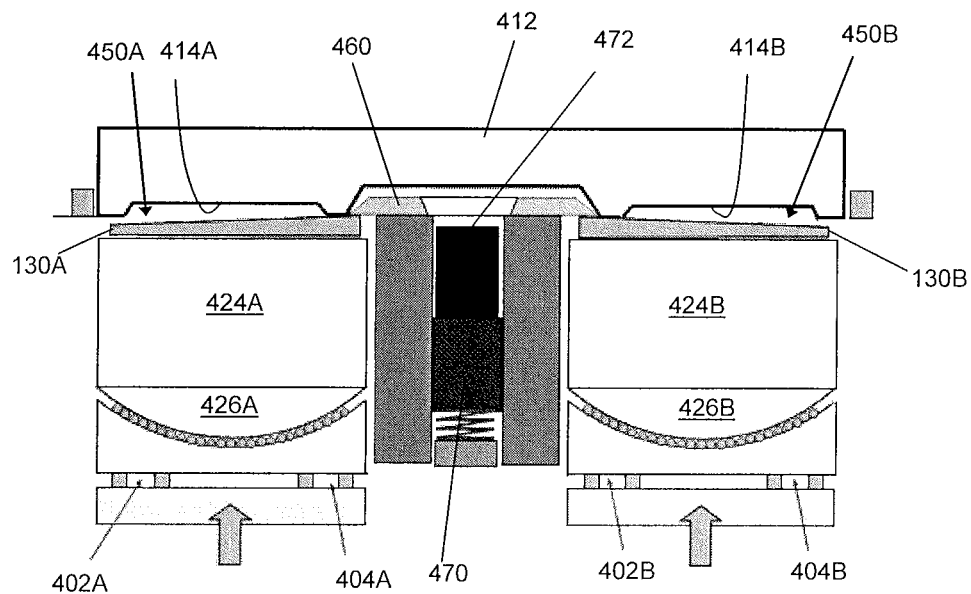
Figure 14:
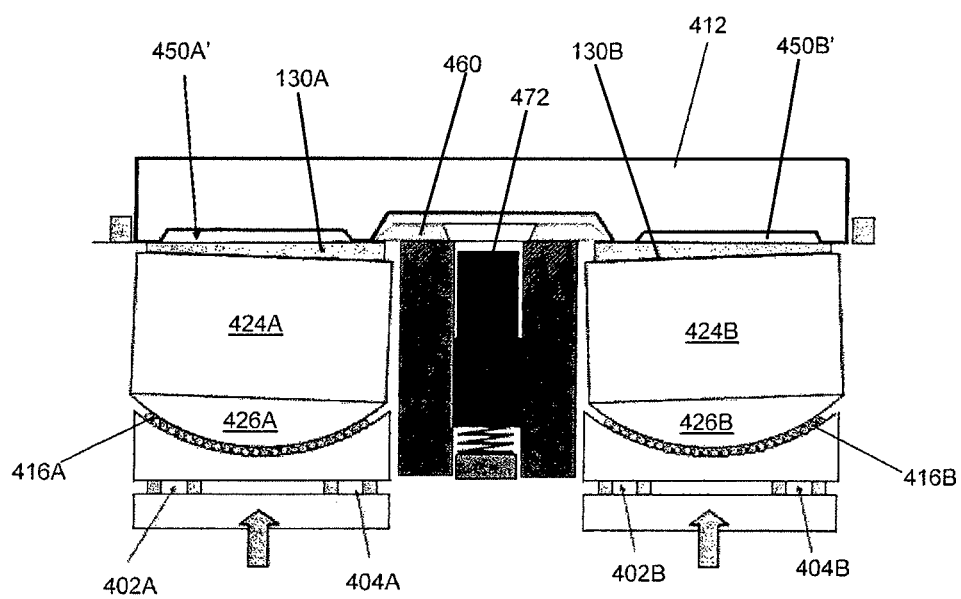

As shown in FIG. 13, the upper platen and upper mold chase 412 are urged towards the lower platens 420A, 420B (or vice versa if preferred, in the direction indicated by the solid arrows). As the upper mold chase 412 contacts the substrates 130A and 130B retained on lower mold chases 422A, 422B, it encounters surface unevenness for each substrate. Substrate 130A is thicker at one edge 138A than the other edge 136A, such that edge 438A of the first recess of the upper mold chase 412 contacts substrate edge 138A before edge 436A contacts substrate edge 136A. Thus, as can be seen from FIG. 13, the mold cavity 450A between surface 414A and substrate 130A is not properly formed since substrate 130A is not clamped at edge 136A. Similarly, substrate 130B is not properly clamped at edge 138B such that mold cavity 450B is not properly formed at the second lower mold chase 422B.

In order to correctly form the mold cavities, load cells 402A and 404A of the first lower platen 420A and load cells 402B and 404B of the second lower platen 420B are used to measure differences in compression force at the respective edges and to provide feedback to respective independent drive mechanisms of the lower platens. At lower platen 420A, load cell 402A measures a lower force than load cell 404A, such that the drive mechanism is actuated to rotate top portion 424A and middle portion 426A relative to bottom portion 428A on the roller bearing 416A, in the direction of edge 138A of substrate 130A. The drive mechanism is operative until the forces at load cells 402A and 404A are balanced. Similar principles apply to the second lower platen 420B, except that the force at load cell 402B is measured to be higher than that at load cell 404B, so that the top portion and middle portion 424B, 426B need to be rotated in the opposite direction to the corresponding portions of the first lower platen 420A. Once the forces are balanced, properly formed mold cavities 450A' and 450B' are obtained, with the surfaces 414A and 414B being parallel to respective substrates 130A and 130B. At this point, a charge 472 of resin loaded in the pot can be heated and the molten resin pushed through plunger pot/runner system 460 into the cavities 450A' and 450B' and cured to complete the molding process.

Although particular embodiments of the invention have been described in detail, many modifications and variations are possible within the scope of the invention, as will be clear to a skilled reader. For example, the rotational mountings 220, 222 of the lower platen 120 as described above can be incorporated within the upper platen 110 instead, so as to achieve co-planarity between the substrate and the opposed surface of the mold cavity. Alternatively, both the upper and lower platens 110, 120 may comprise corresponding rotational mountings to achieve the desired objective. For example, each platen 110, 120 may comprise a rotational mounting device which comprises at least one rotational mounting such as a roller bearing. Yet further, the upper mold chase 112 or the lower mold chase 122 is rotatable on the rotational mounting device about at least one axis passing through the centre of the substrate-facing surface to adjust the relative arrangement of the upper and lower mold chase surfaces for clamping the substrate in-between. In one variant, the upper mold chase 112 may be rotatable about a first axis while the lower mold chase 122 is rotatable about a second axis orthogonal to the first axis. In another variant, each of the upper 112 and lower 122 mold chases may be rotatable about two orthogonal axes passing through the centre of the substrate-facing surface.

The invention claimed is:

1. A molding press for encapsulating semiconductor dies on a substrate, the molding press comprising:
   a first mold chase with a first mold chase surface; and
   a second mold chase with a second mold chase surface;
   the first and second mold chases being operable to clamp a substrate, which is held against a substrate-facing surface relating to either the first or second mold chase surface, between the first and second mold chase surfaces to define at least one mold cavity with respect to the substrate;
   wherein the molding press further comprises a rotational mounting device on which either the first or second mold chase is rotatable about an axis passing through a centre of the substrate-facing surface to adjust the relative arrangement of the first and second mold chase surfaces.

2. The molding press according to claim 1, wherein the rotational mounting device is configured to allow rotation of either the first or second mold chase about at least one of two orthogonal axes each passing through the centre of the substrate-facing surface to adjust the relative arrangement of the first and second mold chase surfaces.

3. The molding press according to claim 1, wherein the second mold chase is part of a platen, the platen comprising a drive mechanism configured to rotate the lower mold chase.

4. The molding press according to claim 3, wherein the platen comprises the rotational mounting device.

5. The molding press according to claim 1, wherein the rotational mounting device comprises roller bearings.

6. The molding press according to claim 4, wherein the platen comprises a top portion, a middle portion to which the top portion is mounted by a first rotational mounting, and a base portion to which the middle portion is mounted by a second rotational mounting; wherein the drive mechanism is configured to rotate the top portion relative to the middle portion about the first rotational mounting, and the middle portion relative to the base portion about the second rotational mounting.

7. The molding press according to claim 4, wherein the platen comprises a plurality of load cells positioned to measure clamping forces applied at opposed edges of a substrate during clamping; and wherein the drive mechanism is configured to rotate the top portion or the middle portion, or both, to balance said clamping forces.

8. The molding press according to claim 7, wherein the load cells are positioned between first and second parts of the top portion of the platen.

9. The molding press according to claim 7, wherein the load cells are positioned beneath the base portion.

10. The molding press according to claim 7, wherein the load cells are positioned in alignment with two orthogonal axes passing through the centre of the substrate-facing surface to adjust the relative arrangement of the first and second mold chase surfaces.

11. The molding press according to claim 6, wherein the second mold chase comprises a clamping plate coupled to the top portion by a plurality of springs, the clamping plate comprising a plurality of gauging sensors positioned to measure spring compression at different locations on the clamping plate; and wherein the drive mechanism is configured to rotate the top portion and/or the middle portion to minimize any differences in the measured spring compression at the different locations.

12. The molding press according to claim 11, wherein the gauging sensors are positioned in alignment with two orthogonal axes passing through the centre of the substrate-facing surface to adjust the relative arrangement of the first and second mold chase surfaces.

13. A platen for a molding press for encapsulating semiconductor dies on a substrate, the platen comprising:
 a first mold chase having a first mold chase surface;
 the platen being operable to cooperate with a further platen having a second mold chase with a second mold chase surface to clamp a substrate, which is held against a substrate-facing surface relating to either the first or second mold chase surface, between the first and second mold chase surfaces to define at least one mold cavity with respect to the substrate;
 wherein the platen further comprises a rotational mounting device on which either the first or second mold chase is rotatable about an axis passing through a centre of the substrate-facing surface to adjust the relative arrangement of the first and second mold chase surfaces.

14. The platen according to claim 13, wherein the rotational mounting device is configured to allow rotation of the either the first or second mold chase about at least one of two orthogonal axes each passing through the centre of the substrate-facing surface to adjust the relative arrangement of the upper and lower mold chase surfaces.

15. The platen according to claim 13, further comprising a drive mechanism configured to rotate the first mold chase.

16. The platen according to claim 13, wherein the rotational mounting device comprises roller bearings.

17. The platen according to claim 13, comprising a top portion, a middle portion to which the top portion is mounted by a first rotational mounting, and a base portion to which the middle portion is mounted by a second rotational mounting; wherein the drive mechanism is configured to rotate the top portion relative to the middle portion about the first rotational mounting, and the middle portion relative to the base portion about the second rotational mounting.

18. The platen according to claim 17, further comprising a plurality of load cells positioned to measure clamping forces applied at opposed edges of a substrate during clamping; wherein the drive mechanism is configured to rotate the top portion and/or the middle portion to balance said clamping forces.

19. The platen according to claim 18, wherein the load cells are positioned between first and second parts of the top portion.

20. The platen according to claim 18, wherein the load cells are positioned beneath the base portion.

21. The platen according to claim 18, wherein the load cells are positioned in alignment with two orthogonal axes.

22. The platen according to claim 17, comprising a clamping plate coupled to the top portion by a plurality of springs, the clamping plate comprising a plurality of gauging sensors positioned to measure spring compression at different locations on the clamping plate; and wherein the drive mechanism is configured to rotate the top portion or the middle portion, or both, to minimize any differences in the measured spring compression at the different locations.

23. The platen according to claim 22, wherein the gauging sensors are positioned in alignment with two orthogonal axes passing through the centre of the substrate-facing surface to adjust the relative arrangement of the upper and lower mold chase surfaces.

24. A molding press for encapsulating semiconductor dies on a substrate, the molding press comprising:
 a first mold chase with a first mold chase surface; and
 a second mold chase with a second mold chase surface;
 the first and second mold chases being operable to clamp a substrate, which is held against a substrate-facing surface relating to either the first or second mold chase surface, between the first and second mold chase surfaces to define at least one mold cavity with respect to the substrate;
 wherein the molding press further comprises a top portion, a middle portion to which the top portion is mounted by a first rotational mounting, and a base portion to which the middle portion is mounted by a second rotational mounting; and
 a drive mechanism configured to rotate the top portion relative to the middle portion about the first rotational mounting, and the middle portion relative to the base portion about the second rotational mounting, to adjust the relative arrangement of the first and second mold chase surfaces.

* * * * *